United States Patent
Stitt, II et al.

(10) Patent No.: US 6,225,684 B1
(45) Date of Patent: May 1, 2001

(54) LOW TEMPERATURE COEFFICIENT LEADFRAME

(75) Inventors: R. Mark Stitt, II; Larry D. Hobson, both of Tucson, AZ (US)

(73) Assignee: Texas Instruments Tucson Corporation, Tucson, AZ (US)

( * ) Notice: Subject to any disclaimer, the term of this patent is extended or adjusted under 35 U.S.C. 154(b) by 0 days.

(21) Appl. No.: 09/515,300

(22) Filed: Feb. 29, 2000

(51) Int. Cl.⁷ .................................................. H01L 23/495
(52) U.S. Cl. ............................................. 257/666; 257/677
(58) Field of Search ....................... 257/666, 677

(56) References Cited

U.S. PATENT DOCUMENTS

| | | |
|---|---|---|
| 3,922,712 | 11/1975 | Stryker . |
| 4,019,168 | 4/1977 | Collins . |
| 4,021,277 | 5/1977 | Shirn et al. . |
| 4,104,607 | 8/1978 | Jones . |
| 4,141,029 | 2/1979 | Dromsky . |
| 4,297,647 | * 10/1981 | Akiyama et al. . |
| 4,579,600 | 4/1986 | Shah et al. . |
| 4,591,821 | 5/1986 | Paulson et al. . |
| 4,726,232 | 2/1988 | Koneval . |
| 4,774,491 | 9/1988 | Vugts . |
| 4,780,702 | 10/1988 | Snel et al. . |
| 4,803,457 | 2/1989 | Chapel, Jr. et al. . |
| 4,808,009 | 2/1989 | Sittler et al. . |

(List continued on next page.)

FOREIGN PATENT DOCUMENTS

| | | |
|---|---|---|
| 3717246 A1 | 11/1987 | (DK) . |
| 359177950 | 10/1984 | (JP) . |

OTHER PUBLICATIONS

"Copper & Copper Alloys", Leadframe Materials from Tamagawa, Brochure, 1983, Tamagawa Metal & Machinery Co., Ltd.

"Precision–Amp/Resistor Combo Forms One–Chip Sensing Solution", Product Highlights, Electronic Products, Sep. 1998.

* cited by examiner

*Primary Examiner*—Sheila V. Clark
(74) *Attorney, Agent, or Firm*—Snell & Wilmer, L.L.P.

(57) ABSTRACT

A leadframe is provided which has an integrated resistive element incorporated within the leadframe. The resistive element suitably comprises a material that can provide a temperature coefficient of under 500 ppm/° C., preferably approximating 100 ppm/° C. or less. Exemplary embodiments of the resistive material may include Constantan or Manganin.

The leadframe and integrated resistive element may be utilized in a variety of integrated circuit applications, such as a current monitoring circuit. Accordingly, variations in temperature will not dramatically affect the accuracy of any integrated circuit devices during operation. Additionally, after encapsulation of the leadframe and integrated resistive element and any such integrated circuit device, the gain of the encapsulated circuit may be suitably adjusted by various calibration techniques.

16 Claims, 2 Drawing Sheets

U.S. PATENT DOCUMENTS

| | | |
|---|---|---|
| 4,872,048 | 10/1989 | Akutsu et al. . |
| 4,888,449 | 12/1989 | Crane et al. . |
| 4,908,078 | 3/1990 | Muramatsu et al. . |
| 4,970,569 | 11/1990 | Mori et al. . |
| 5,023,589 | 6/1991 | Hall . |
| 5,023,684 * | 6/1991 | Tsunda . |
| 5,041,191 | 8/1991 | Watson . |
| 5,221,859 | 6/1993 | Kobayashi et al. . |
| 5,329,158 | 7/1994 | Lin . |
| 5,329,159 | 7/1994 | Lin . |
| 5,343,073 | 8/1994 | Parthasarathi et al. . |
| 5,448,103 | 9/1995 | de Wit . |
| 5,449,951 | 9/1995 | Parthasarathi et al. . |
| 5,463,248 | 10/1995 | Yano et al. . |
| 5,498,984 | 3/1996 | Schaffer . |
| 5,521,432 | 5/1996 | Tsuji et al. . |
| 5,534,788 | 7/1996 | Smith et al. . |
| 5,546,048 | 8/1996 | Sano et al. . |
| 5,554,873 | 9/1996 | Erdeljac et al. . |
| 5,567,358 | 10/1996 | Makuta et al. . |
| 5,585,776 | 12/1996 | Anderson et al. . |
| 5,629,563 * | 5/1997 | Takiar et al. . |
| 5,734,314 | 3/1998 | Kuo . |
| 5,804,880 | 9/1998 | Mathew . |
| 6,091,318 * | 7/2000 | Lee et al. . |
| 6,150,615 * | 11/2000 | Suzuki . |

LOW TEMPERATURE COEFFICIENT LEADFRAME

FIELD OF THE INVENTION

The present invention relates to a leadframe for integrated circuits. More particularly, the present invention relates to a resistor element having a low temperature Coefficient of Resistivity (TCR) and configured within a leadframe, such as may be used to facilitate current measuring applications and the like.

BACKGROUND OF THE INVENTION

Although various other types of packaging methodologies, for example, metallic and ceramic packaging, can be used with microelectronic devices, molded plastic encapsulated packaging continues to be greatly used by industry. This packaging is typically low cost, is easy to assemble, and provides adequate protection of the device from water vapor and other contaminants. Typically, the microelectronic device is mounted on a die pad and then electrically connected to a leadframe. The leadframe generally facilitates a number of wiring connections. After encapsulation, the outer leads of the leadframe can be connected, such as by soldering, to a printed circuit board or other external device. Thereafter, the packaged device may be utilized for various applications, such as for voltage or current monitoring and the like, or other conventional integrated circuit applications. Once packaged, however, the microelectronic devices can be difficult to calibrate with traditional techniques.

Many semiconductor devices and integrated circuits are designed to operate over wide temperature ranges. For example, high currents can cause significant changes in temperature for an integrated circuit. However, these temperature ranges can dramatically affect the operation of various elements within these semiconductor devices. In particular, changes in temperature can detrimentally impact resistor elements by changing the resistance thereof. The change in resistance with temperature is generally known as the temperature coefficient of resistance (TCR) and is determined by measuring the incremental change in resistance of a resistive material with temperature change. Typically, the TCR is measured in parts per million variation per degree centigrade, or ppm/° C.

In manufacturing integrated circuits, many attempts have been made reduce the exposure of the circuits to problems caused by higher temperature coefficients and thus increase the precision of the circuits. For example, one solution includes the selection of equal value resistors having matching negative and positive TCR's to facilitate cancellation of the temperature coefficients. However, the selection process is costly to manufacturing and the selected resistors can realize gradual shift that causes the initial matching of the TCR's to become unsuitable. Another approach to reduce the problem caused by temperature coefficients is the use of thin-film resistors that have lower temperature coefficients, such as precision resistors comprising, for example, tantalum, nickel-chromium or Cermet (Cr—SiO). However, a drawback to such prior art resistors has been the associated high costs for the additional processing required during fabrication. Still further, other approaches to the problem caused by temperature coefficients have included the manipulation of the materials by annealing with temperature, or the careful controlling of the deposition of substrates during manufacture of the resistor elements. However, such manipulation and control processes have proven complex, costly and often unpredictable.

To reduce the size and manufacturing expense of packaged integrated circuit devices, resistive elements have been integrated into an integrated circuit package as a part of the leadframe assembly. However, the above problems caused by the TCR in the resistors are still prevalent. Thus, attempts to minimize the effects of TCR have included the providing of temperature compensation capabilities after fabrication of the encapsulated microelectronic device. For example, one technique discloses a method of compensating for measurement fluctuations caused by temperature variations arising the temperature coefficients of resistors. In particular, the above technique discloses the use of additional sensing electronics having post-fabrication temperature compensation capabilities within a current sensing application. Generally, the sensing electronics include a sensing resistor comprising various metals, such as copper, which has a temperature coefficient of approximately 3800 ppm/° C., Alloy 42, which has a temperature coefficient of approximately 2500 ppm/° C., or nickel alloys, which have a temperature coefficient of approximately 3300 ppm/° C. Accordingly, the temperature compensation circuit is designed to measure the temperature variations caused by the temperature coefficient of the sensing resistor and then essentially cancel out the variations with an offset temperature compensation reference voltage. While such techniques may provide adequate results, the additional complexity and associated manufacturing costs can prove undesirable in many applications.

Accordingly, a long-felt need exists for a leadframe having a low temperature coefficient resistor element, for example under 500 ppm/° C., which does not require complex schemes for reducing the temperature coefficient, such as the temperature coefficient cancellation or other resistor manipulation processes described above. Moreover, a long-felt need exists for a current monitoring circuit having a self-contained current sensor within a leadframe and coupled to a microelectronic device in which the current monitoring circuit does not require post-fabrication temperature compensation or other complex techniques.

SUMMARY OF THE INVENTION

A leadframe in accordance with the present invention addresses many of the shortcomings of the prior art. In accordance with one aspect of the present invention, the leadframe is configured to provide a resistive element incorporated within the leadframe. The resistive element suitably comprises a material that can provide a temperature coefficient of under 500 ppm/° C., preferably approximating 100 ppm/° C. or less, while also being readily configurable for integrated circuits. Exemplary embodiments of the resistive material may include Constantan, Manganin, or Evanohm.

The leadframe and integrated resistive element may be utilized in a variety of integrated circuit applications. An exemplary embodiment includes the incorporation of the leadframe and integrated resistive element with a microelectronic device in a current monitoring circuit. Accordingly, variations in temperature will not dramatically affect the accuracy of the leadframe current sensing resistor during operation. Additionally, after encapsulation of the leadframe and integrated resistive element and any such integrated circuit device, the gain of the encapsulated circuit may be suitably calibrated or adjusted by various calibration techniques.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF PREFERRED EMBODIMENTS OF THE INVENTION

The present invention is described herein in terms of various hardware components and processing steps. It should be appreciated that such components may be realized by any number of hardware components configured to perform the specified functions. For example, in its various embodiments the present invention may include various integrated circuit components, e.g., transistors, amplifiers, digital signal processing elements, integrators, and the like, which may carry out a variety of functions either directly or under the control of one or more microprocessors or other control devices. In addition, those skilled in the art will appreciate that the present invention may be practiced in any number of packaging contexts and that the illustrative embodiment described herein is merely one exemplary application for the invention. For example, the exemplary leadframe may be suitably packaged within ceramic, metallic or other materials and configured in various arrangements, such as, dual-in-line packages, quad flat packages, small outline packages and the like. Further, it should be noted that the present invention may employ any number of conventional techniques for filtering, signal processing and conditioning, and the like. Still further, it should be noted that the present invention may be suitably practiced within any integrated circuit application, and may be particularly advantageous in high current applications in which a low temperature coefficient of resistivity is desirable. Such general techniques that may be known to those skilled in the art are not described in detail herein.

As discussed above, prior art resistive elements incorporated as a part of a leadframe and made from materials such as copper or nickel have provided a temperature coefficient of 2500 ppm/° C. or more. In addition, such resistive elements integrated into a leadframe have required some form of manipulation or temperature compensation to address the problems caused by temperature coefficients. Accordingly, a long-felt need exists for a leadframe having a low temperature coefficient resistor element, for example under 500 ppm/° C., which does not require complex schemes for reducing the temperature coefficient to such desirable levels. In this regard, in accordance with the present invention, it has been discovered that an acceptably low temperature coefficient of resistivity (TCR) material can be incorporated into a leadframe to provide a non-complex solution to the problems caused by temperature variation. In addition, such a low TCR material is also readily configurable for integrated circuits, e.g., the material can be wire bonded, can be soldered, can facilitate die attachment, and can be fabricated into a leadframe.

Figure 1:
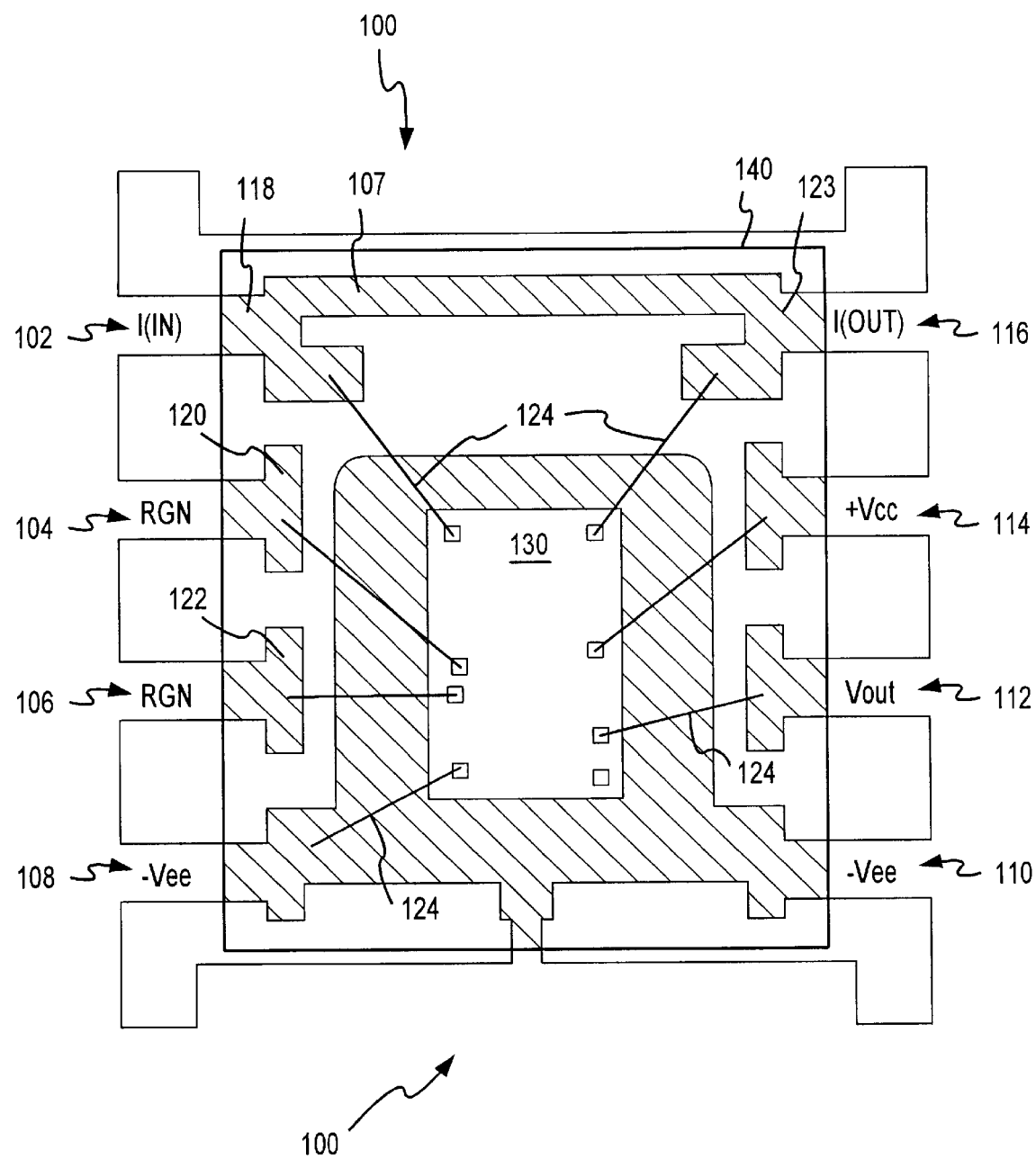
FIG. 1 is a plan view of an exemplary leadframe prior to encapsulation in accordance with an embodiment of the present invention.

With reference to FIG. 1, an exemplary embodiment of such a low TCR material incorporated into a leadframe is illustrated. Although a leadframe configured with a current shunt arrangement is shown, it should be noted that such a configuration is merely exemplary and various other applications and configurations are equally applicable in accordance with the present invention. In accordance with this exemplary embodiment, a leadframe 100 may suitably include leads, for example, 102, 104, 106, 108, 110, 112, 114 and 116, and a die attach pad 130. Leads 102, 104, 106, 108, 110, 112, 114 and 116 suitably include respective inner portions for coupling or connecting to die attach pad 130. For example, lead 102 includes an inner portion 118, lead 104 includes an inner portion 120, lead 106 includes an inner portion 122 and lead 116 includes an inner portion 123. Further, leads 102, 104, 106, 108, 110, 112, 114 and 116 may be suitably configured to connect or couple with inputs and outputs of other integrated circuit components, such as, for example, current input I(in) or output I(out), voltage sources Vcc and Vee, or voltage output Vout, or to an external gain resistor, RGN. Moreover, it should be noted that with respect to the coupling or connecting of leads or other components, the coupling or connecting may include either the direct connection from one component or lead to another, or may include the connection through another circuit component or device.

Although leadframe 100 may be comprised of a variety of materials, preferably leadframe 100 entirely comprises a low TCR material such as, for example, Constantan or Manganin. Moreover, leadframe 100 preferably comprises the same low TCR material as low TCR resistor element 107, as described below. In addition, it should be noted that leadframe 100 may include any number of leads incorporated in various other configurations and is not limited to those illustrated or described above.

Figure 2:
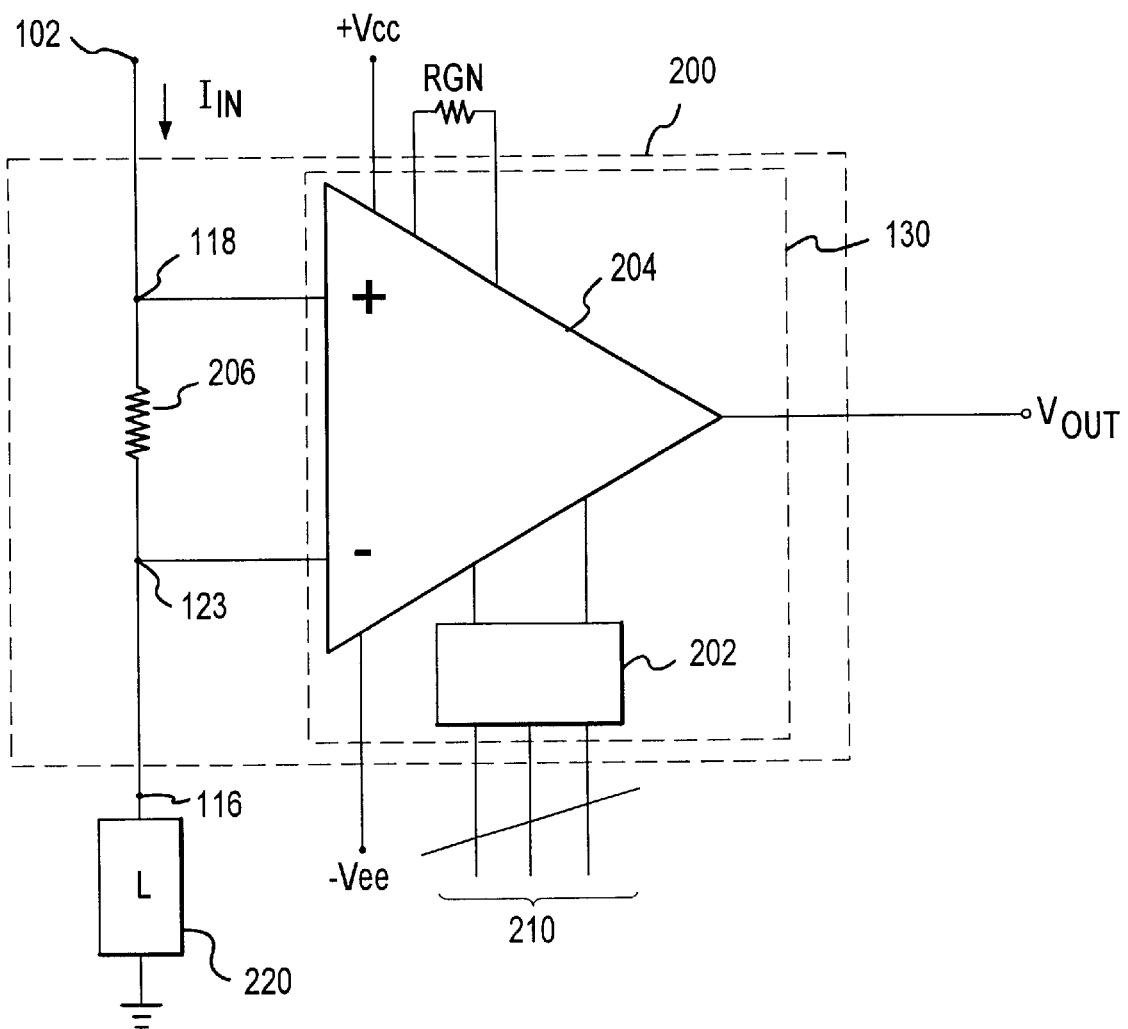
FIG. 2 is a schematic representation of an exemplary integrated circuit that may provide for calibration of an integrated circuit device.

In addition, with momentary reference to FIG. 2, a microelectronic device 204, such as a voltage or current amplifier and the like, can be suitably mounted within leadframe 100. In accordance with the exemplary embodiment, the microelectronic device 204 is suitably bonded to die attach pad 130, and connected via conventional bonding wires 124 to the inner portions of leads 102, 104, 106, 108, 110, 112, 114 and 116 of leadframe 100. Thereafter, microelectronic device 204 and a portion of leadframe 100 may be suitably encapsulated in a packaging material, such as plastic, ceramic or metallic packaging material, to form a protective package as indicated by outline 140.

In accordance with an exemplary embodiment of the present invention, leads 102 and 116 can be configured to include a low TCR resistor element 107, such as a resistor element described more fully below. That is, leads 102 and 116 and inner portions 118 and 123 may suitably provide a resistor element 107 incorporated into leadframe 100. Thus, low TCR resistor element 107, suitably configured within leadframe 100, may be suitably connected to the microelectronic device, such as device 204, prior to encapsulation or packaging. Accordingly, an exemplary integrated circuit 200, such as a voltage or current amplifier or monitoring circuit, can be configured to have a self-contained sensor.

In accordance with an exemplary embodiment, low TCR resistor element 107 comprises a low TCR material such as, for example, Constantan or Manganin. Preferably, low TCR resistor element 107 comprises the substantially same low TCR material as leadframe 100, i.e., low TCR resistor element 107 and leadframe 100 may be suitably manufactured from the same material. The low TCR material, as may be utilized for low TCR resistor element 107 and leadframe 100, is suitably configured to provide a temperature coefficient of under 500 ppm/° C.

For example, the low TCR material may comprise Constantan material. The Constantan material is a resistance alloy with moderate resistivity and a generally flat resistance/temperature curve. The Constantan material may suitably provide a temperature coefficient of under 25 ppm/° C., preferably approximating 10 ppm/° C. or less. Further, the Constantan material is comprised of approximately 40% to 45% nickel and 55% to 60% copper. Moreover, the Constantan material provides good corrosion resistance.

In addition, the low TCR material may comprise Manganin material. Like the Constantan material, the Manganin material may suitably provide a temperature coefficient of under 25 ppm/° C., preferably approximating 15 ppm/° C. or less. The Manganin material is also a resistance alloy with moderate resistivity, however, the resistance/temperature curve is generally not as flat and the corrosion resistance is not as preferable as that provided by the Constantan material. The Manganin material is comprised of approximately 12% to 14% manganese, 3% to 5% nickel, and 81% to 85% copper.

However, in addition to the desirable low TCR characteristics, it is equally important that the low TCR material have other characteristics to make it readily configurable for integrated circuits, including being easily wire bonded, having excellent solder ability, and can facilitate die attachment. Due to the physical characteristics of these materials required in accordance with the present invention, the selection of Constantan and/or Manganin is particularly attractive for the process of etching or stamping the leadframe, the process of transfer molding, as well as the above characteristics.

Other low TCR materials may also be utilized in accordance with the present invention. For example, an alloy known as Evanohm-R may suitably provide a temperature coefficient of under 25 ppm/° C., preferably approximating 10 ppm/° C. or less. The Evanohm-R material is suitably comprised of approximately 0% to 2% manganese, 73% to 77% nickel, 2% to 3% aluminum, 18% to 22% chromium, and 1% to 2% copper. Still further, other materials having a temperature coefficient of under 500 ppm/° C., preferably under 100 ppm/° C. may also be incorporated into leadframe 100 in accordance with various exemplary embodiments of the present invention. Preferably, such other materials suitably provide other characteristics as described above to make it readily configurable for integrated circuits, such as by being easily wire bonded, having excellent soldering ability, and/or can facilitate die attachment.

As a result of low TCR resistor element 107 having a temperature coefficient of less than 500 ppm/° C., for example, approximating 25 ppm/° C. or less, variations in temperature will not dramatically affect the accuracy of microelectronic device 130 during operation, such as during any current monitoring applications. In addition, with the exception of the need to calibrate the integrated circuit with regard to DC resistance, using a stable resistive element such as Constantan or Manganin substantially eliminates the need to calibrate microelectronic device 130 prior to becoming permanently encapsulated. Moreover, the concern of later instability in the resistive element during operation is substantially reduced, even when used in high current applications.

In accordance with another aspect, an exemplary low TCR resistor element may comprise a plurality of "squares", for example, between 15–25 "squares" of a low TCR material. The term "squares" is generally used by industry to describe a measure of the aspect ratio, i.e., the effective length divided by the width, for a given resistive element. Preferably, such exemplary low TCR resistor element may comprise a material between 0.015 cm to 0.025 cm in thickness, and having a rolled resistivity of between 25 and 150±20% μOhm-Cm. Accordingly, various thickness and resistivity values may be utilized depending on any number of design parameters. For example, Constantan may suitably provide a rolled resistivity of approximately 51±20% μOhm-Cm, while Manganin may suitably provide a rolled resistivity of approximately 38±20% μOhm-Cm. Moreover, although not necessary, the low TCR resistor element may be further heat treated to adjust the temperature coefficient to approximately 0±10 ppm/° C. or less.

Moreover, various shapes and interconnect patterns of low TCR resistor may be provided depending on the desired resistance. For example, the low TCR resistor may comprise various lengths of material between lead 102 and lead 116. For example, as illustrated in FIG. 1, a fixed substantially straight length may be provided. However, low TCR resistor may also comprise a shorter pattern, or a longer pattern, such as a long serpentine-like pattern. Thus the shape and size of low TCR resistor is suitably selected to achieve a selected resistance and current carrying capacity, depending on any number of different design criteria.

By incorporating within a leadframe a low TCR resistive material, such as Constantan or Manganin, having a temperature coefficient of less than 500 ppm/° C., preferably approximating 100 ppm/° C. or less, variations in temperature will not dramatically affect the accuracy of microelectronic devices during operation, such as during any current monitoring applications.

As discussed above, once a leadframe and a microelectronic device are packaged, i.e., after molding or encapsulating of the device, it is difficult to further calibrate any circuit components integral to the package. For example, existing laser trimming and other package level trimming techniques and the like are either very difficult to apply or can not be utilized. In accordance with the present invention, such package level trimming techniques are not necessary for adjustment or calibration of the integrated circuit and related components due to changes in temperature. However, in accordance with another aspect of the present invention, it may be desirable to provide integrated circuitry configured for on-board calibration of the gain, i.e., the ability to adjust the gain of the amplifier device within the leadframe packaging, after transfer molding and encapsulating of the leadframe. In accordance with this aspect of the invention, a calibration circuit can be provided to facilitate active calibration of signal conditioning and/or gain circuitry after packaging. In addition, the on-board calibration circuit can be included with microelectronic device 204, for example, either as a separate device or as an integrated part of microelectronic device 204.

With reference to FIG. 2, an exemplary on-board calibration circuit 202 is shown. In accordance with this example, an amplifier circuit 200, such as a voltage or current amplifier circuit configured for voltage or current monitoring, can include microelectronic device 204 and a resistive element 206. Microelectronic device 204 suitably comprises a conventional integrated circuit device, such as an amplifier, while resistive element 206 suitably comprises a low TCR material having a temperature coefficient of less than 500 ppm/° C., preferably approximating 100 ppm/° C. or less.

Additionally, microelectronic device 204 and resistive element 206 are incorporated onto or within a leadframe. Moreover, device 204, resistive element 206 and calibration circuitry 202 are encapsulated in packaging materials, as described above. As such, direct calibration of the gain of amplifier circuit 200 though conventional laser trimming techniques and the like can not be readily facilitated. However, through operation of calibration circuitry 202, gain adjustment of amplifier circuit 200 can be realized.

In accordance with one aspect, calibration circuitry 202 facilitates adjustment of the gain through the use of various conventional techniques. For example, calibration circuitry 202 can provide connection via a data bus 210, such as dedicated I/O pins and the like, to conventional calibration systems. In accordance with an exemplary embodiment, calibration circuitry 202 comprises a resistor network, preferably in a parallel arrangement, that can be selectively configured to adjust the gain of amplifier circuit 200. Additionally, calibration circuitry 202 can comprise various numbers of resistor components, for example, eight resistors, each comprising the same and/or different resistance values depending on various design criteria. Moreover, each of the resistors can be configured with a dedicated I/O pin, or can be selectively addressed, for example via a binary coding scheme, to interface to a calibration system.

The calibration system can include various conventional calibration systems, wherein the methodology for calibration may comprise the selection of particular resistors to be included within the calibration circuit. For example, one calibration scheme can include the use of EPROM or EEPROM devices in series with the sensor elements to selectively incorporate particular resistors by selectively charging certain MOSFET gates and the like. Another calibration scheme can include the use of high current to selectively "blow out" a fuse link in series with the resistor components in calibration circuitry 202, i.e., a "fusible links" application. Still further, similar to the "fusible links" scheme, another calibration method can include the use of zener diodes which can be used with resistor networks to compensate for gain error. Moreover, it should be noted that various other alternative calibration schemes can be equally applied as well.

Having described exemplary embodiments for a leadframe and an onboard calibration circuit, an exemplary operation of such a leadframe and circuit with a current monitoring application will now be described. For example, in a current monitoring application, one may desire to measure the current $I_{IN}$ passing through a load device 220. Prior art integrated circuits which utilize an integrated resistor must not only evaluate the current passing through the integrated resistor, but must also incorporate a temperature compensation circuit to assess the changes in resistance of the integrated resistor caused by changes in temperature, thus adding significant complexity and costs to the circuit. However, in accordance with the present invention, such additional compensation circuitry is not necessary. Accordingly, a current monitoring circuit 200 may suitably include an integrated resistive element 206 suitably coupled between an input device and load device 220 to effectively measure the current $I_{IN}$ passing through load device 220. In other words, the voltage potential occurring between inner portions 118 and 123 is suitably realized at the input of amplifier 204 to provide an output voltage $V_{out}$ indicative of the current $I_{IN}$. Moreover, as a result of the low TCR characteristics of resistive element 206, no additional TCR compensation circuitry is necessary.

The present invention has been described above with reference to an exemplary embodiment. However, changes and modifications may be made to the exemplary embodiment without departing from the scope of the present invention. For example, the various components of the leadframe may be implemented in alternate ways depending upon the particular application or in consideration of any number of cost functions associated with the operation of the system, e.g, the leads may be configured in different sequences or in different areas of an integrated circuit. Further, various selected outer or inner leads of the leadframe may comprise the same or different materials, for example, all from the same low TCR material, each with different low TCR materials or other materials which do not have a low TCR characteristic. In addition, the techniques described herein may be extended or modified for use with various other applications, such as, for example, a voltage monitoring or converters. These and other changes or modifications are intended to be included within the scope of the present invention.

We claim:

1. An integrated circuit for use in voltage and current monitoring applications, said circuit comprising:
   a leadframe having an integrated resistive element, said leadframe comprising a material having a temperature coefficient of under 500 ppm/° C.;
   an integrated circuit component mounted on said leadframe and coupled to said integrated resistive element; and
   an encapsulating material configured around said integrated circuit and a portion of said leadframe.

2. An integrated circuit according to claim 1, wherein said leadframe material provides a temperature coefficient of 100 ppm/° C. or less.

3. An integrated circuit according to claim 1, said integrated circuit comprising a current monitoring circuit.

4. An integrated circuit according to claim 1, wherein a gain adjustment of said integrated circuit can be realized after encapsulation of said leadframe and said integrated circuit device.

5. An integrated circuit according to claim 1, wherein said leadframe material comprises at least one of a Constantan material, a Manganin material, and an Evanohm material.

6. An integrated circuit according to claim 5, wherein said leadframe material provides a temperature coefficient of 25 ppm/° C. or less.

7. A leadframe for use with an integrated circuit, said leadframe comprising:
   a die pad for mounting an integrated circuit device; and
   an integrated resistive element, wherein said resistive element provides a temperature coefficient of under 500 ppm/° C.

8. A leadframe according to claim 7, wherein said resistive element provides a temperature coefficient of 100 ppm/° C. or less.

9. A leadframe according to claim 7, wherein said resistive element comprises a material of at least one of a Constantan material, a Manganin material, and an Evanohm material.

10. A leadframe according to claim 9, wherein said resistive element provides a temperature coefficient of 25 ppm/° C. or less.

11. A leadframe according to claim 9, wherein said leadframe is comprised of said material comprising said resistive element.

12. A current monitoring circuit comprising:
   a leadframe having an integrated resistive element and a die attach pad, said leadframe comprising a material having a temperature coefficient of under 500 ppm/° C.;
   an amplifier device mounted on said die attach pad of said leadframe and coupled to said integrated resistive element; and an encapsulating material configured around said amplifier device and a portion of said leadframe,
wherein said current monitoring circuit is configured to operate during variations of temperature without the use of temperature compensation circuitry.

13. A current monitoring circuit according to claim 12, wherein said leadframe material provides a temperature coefficient of 100 ppm/° C. or less.

14. A current monitoring circuit according to claim 12, wherein a gain adjustment of said current monitoring circuit can be realized after encapsulation of said leadframe and said amplifier device.

15. A current monitoring circuit according to claim 12, wherein said leadframe material comprises at least one of a Constantan material, a Manganin material, and an Evanohm material.

16. An current monitoring circuit according to claim 15, wherein said leadframe material provides a temperature coefficient of 25 ppm/° C. or less.

* * * * *